(12) United States Patent
Urashita et al.

(10) Patent No.: US 9,918,417 B2
(45) Date of Patent: Mar. 13, 2018

(54) SHIELD WIRE

(71) Applicant: TATSUTA ELECTRIC WIRE & CABLE CO., LTD., Osaka (JP)

(72) Inventors: Kiyotaka Urashita, Kyoto (JP); Yoshinori Kawakami, Osaka (JP)

(73) Assignee: TATSUTA ELECTRIC WIRE & CABLE CO., LTD., Osaka (JP)

(*) Notice: Subject to any disclaimer, the term of this patent is extended or adjusted under 35 U.S.C. 154(b) by 0 days.

(21) Appl. No.: 15/502,680

(22) PCT Filed: Aug. 7, 2015

(86) PCT No.: PCT/JP2015/072521
§ 371 (c)(1),
(2) Date: Feb. 8, 2017

(87) PCT Pub. No.: WO2016/024544
PCT Pub. Date: Feb. 18, 2016

(65) Prior Publication Data
US 2017/0231125 A1    Aug. 10, 2017

(30) Foreign Application Priority Data
Aug. 12, 2014 (JP) .................. 2014-164408

(51) Int. Cl.
*H01B 7/18* (2006.01)
*H05K 9/00* (2006.01)
*H01B 7/02* (2006.01)

(52) U.S. Cl.
CPC ......... *H05K 9/0098* (2013.01); *H01B 7/0216* (2013.01); *H01B 7/18* (2013.01)

(58) Field of Classification Search
CPC .......... H05K 9/00; H05K 9/0098; H01B 7/18; H01B 7/02; H01B 7/0216
(Continued)

(56) References Cited

U.S. PATENT DOCUMENTS 3,429,984 A * 2/1969 Alexander ............. H01B 7/182
174/107
3,484,532 A * 12/1969 Anderson ............. H01B 7/228
174/105 R
(Continued)

FOREIGN PATENT DOCUMENTS

JP    5-38719    5/1993
JP    5-120926    5/1993
(Continued)

OTHER PUBLICATIONS

International Search Report of PCT/JP2015/072521 dated Nov. 2, 2015.

*Primary Examiner* — Michael F McAllister
(74) *Attorney, Agent, or Firm* — Rankin, Hill & Clark LLP

(57) ABSTRACT

A shield wire is formed of eight twisted insulated core wires 1, an inclusion 2 between these respective insulated core wires 1, a tape 3 laterally wound around an outer periphery of a core formed of the insulated core wires and inclusion, a drain wire 4 disposed on an outer surface of the tape, a conductive fiber braided body 5 formed on an outer peripheral surface of the tape so as to interpose the drain wire, a sheath 6 that forms an outer peripheral surface of the braided body, and an adhesive layer 7 between the braided body and sheath. A braided body 5' is adhesively integrated to the sheath 6' by an adhesive layer; thus, the braided body 5' is stripped with the sheath. This eliminates a need for a removal work of the braided body after stripping the sheath, thus ensuring good workability of the terminal processing.

6 Claims, 1 Drawing Sheet

(58) Field of Classification Search
USPC ....... 174/107 R, 105 R, 106 R, 113 R, 120 R
See application file for complete search history.

(56) References Cited

U.S. PATENT DOCUMENTS

| | | | | |
|---|---|---|---|---|
| 3,643,007 | A * | 2/1972 | Roberts | H01B 11/1808 174/106 R |
| 4,010,315 | A * | 3/1977 | Mildner | H01B 7/205 174/106 R |
| 4,292,463 | A * | 9/1981 | Bow | B32B 15/08 174/107 |
| 4,510,346 | A * | 4/1985 | Bursh, Jr. | H01B 11/1091 174/106 R |
| 4,541,686 | A * | 9/1985 | Barfuss | G02B 6/4401 174/107 |
| 4,675,475 | A * | 6/1987 | Bortner | D04C 1/06 156/172 |
| 5,216,202 | A * | 6/1993 | Yoshida | H01B 7/182 174/106 R |
| 6,169,251 | B1 * | 1/2001 | Grant | H01B 11/005 174/113 C |
| 6,462,268 | B1 * | 10/2002 | Hazy | H01B 7/1895 174/113 R |
| 2010/0116541 | A1 * | 5/2010 | Eshima | H01B 7/1865 174/388 |
| 2012/0175146 | A1 * | 7/2012 | Oka | H01B 7/225 174/120 R |
| 2013/0269973 | A1 * | 10/2013 | Yukawa | H01B 7/04 174/107 |
| 2015/0268276 | A1 * | 9/2015 | Huang | A61B 8/4444 324/149 |
| 2016/0035459 | A1 * | 2/2016 | Hayashishita | H01B 13/2606 174/107 |

FOREIGN PATENT DOCUMENTS

| | | |
|---|---|---|
| JP | 2001-195924 | 7/2001 |
| JP | 2002-175729 | 6/2002 |
| JP | 2002-538581 | 11/2002 |
| JP | 2007-26909 | 2/2007 |
| JP | 2008-287948 | 11/2008 |

* cited by examiner

SHIELD WIRE

TECHNICAL FIELD

The present invention relates to a shield wire having a shield layer (a shielding layer) against electromagnetic wave.

RELATED ART

This type of shield wire includes a shield wire having a configuration where a plurality of insulated core wires is twisted to form a core, and then, a conductive fiber braided body is formed on an outer periphery of this core, and furthermore, a sheath (an external cover) is disposed outside the conductive fiber braided body (PATENT LITERATURES 1 and 2). The braided body is braided with copper-plating polyester fiber (PATENT LITERATURE 1) or carbon fiber (PATENT LITERATURE 2). The sheath is disposed by extrusion molding of resin such as vinyl chloride (PATENT LITERATURE 1).

This type of shield wire also includes a shielded twisted pair cable where a conductive foil such as an aluminum foil covering an outer periphery of a core formed by twisting insulated core wires, and an external insulator (a sheath) are adhered by an adhesive layer (PATENT LITERATURE 3).

Among these shield wires, terminal processing for coupling to an electrical device or the like is performed by removing the sheath, and the braided body or the conductive foil with necessary lengths from terminals of these shield wires so as to expose the insulated core wires. At this time, as described above, in the case of the wire whose braided body is made of the carbon fiber or the like and sheath is formed of an extrudate of the resin such as polyvinyl chloride, both braided body and sheath are usually not adhered (integrated). Therefore, it is necessary that after stripping the sheath by scissors or a stripper, the exposed braided body is additionally removed to expose the core of the twisted insulated core wires.

On the other hand, it is disclosed that when stripping the external insulator of the cable where the above-described conductive foil and external insulator are adhered by the adhesive layer, the conductive foil can be stripped together with an external insulating layer (see paragraph 0018 in PATENT LITERATURE 3).

CITATION LIST

Patent Literature

PATENT LITERATURE 1: JP-A-2002-175729
PATENT LITERATURE 2: JP-T-2002-538581
PATENT LITERATURE 3: JP-A-2008-287948
PATENT LITERATURE 4: JP-UM-A-5-38719

SUMMARY OF THE INVENTION

Problems to be Solved

As described above, it is necessary for the conventional terminal processing of the braided shield wire, that after stripping the sheath terminal with the necessary length, furthermore, the exposed braided body may be removed from the core of the twisted insulated core wires. Additionally, the braided body is braided so that the work of removing becomes burdensome.

On the other hand, for the shield layer of the cable where the conductive foil and the external insulator are adhered by the adhesive layer, the conductive foil is used. Therefore, compared with using the braided body, using conductive foil may have poor bending resistance and poor electromagnetic shield property.

Under the above-mentioned situation, an object of the present invention is to provide a shield wire having the bending resistance and the electromagnetic shield property comparable to the conventional art and to facilitate terminal processing compared with the conventional art, in the shield wire using the braided body.

Solution to the Problems

To achieve the above-described object, the shield wire using the braided body according to the present invention ensures removing the braided body simultaneously with the above-described stripping of the sheath.

Specifically, the shield wire using the braided body according to the present invention has a configuration where the conductive fiber braided body is adhered to the sheath by an adhesive layer interposed between the above-described conductive fiber braided body and sheath.

Thus, when the sheath is stripped, most part of the braided body adhered (integrated) to this sheath is also simultaneously stripped. Therefore, a removal work of this braided body can be omitted. This facilitates the terminal processing compared with the conventional art.

The adhesive layer is formed on a surface of the conductive fiber braided body. The conductive fiber braided body is adhered (integrated) to the sheath via this adhesive layer. Therefore, a configuration of this braided body is less likely to break even by repeated bends of the wire. Furthermore, deterioration of the bending resistance and the shield property may not occur. Moreover, when tensile force in a longitudinal direction acts on the sheath of the wire, in a case of the conventional shield wire using the braided body that are not adhered to the sheath, the tensile force mainly concentrates on the sheath at outermost layer. On the other hand, at the shield wire according to the present invention, the sheath and the braided body are integrated via the adhesive layer. Therefore, by concentrating the tensile force on the braided body whose Young's modulus is great (difficult to extend), resistance against the tensile force may become possible. As a result, tension resistance of the sheath improves.

Furthermore, in the event that the adhesive layer is made of thermoplastic adhesive resin, the sheath is usually formed by extrusion molding of the resin. Therefore, heat of the resin in this extrusion molding melts the adhesive resin so both resins may be firmly connected. As a result, this improves connection strength of the conductive fiber braided body and the sheath via the adhesive layer. This facilitates to reduce the above-described deterioration of the bending resistance and the shield property.

As a configuration of the present invention, the following configuration can be adopted. A shield wire includes: a plurality of insulated core wires twisted to form a core, a conductive fiber braided body formed on an outer periphery of the core, and a sheath disposed outside the conductive fiber braided body. An adhesive layer is interposed between the conductive fiber braided body and the sheath. The adhesive layer adheres the conductive fiber braided body to the sheath.

According to this configuration, similar to the conventional art, an earth may be performed by coupling conductive fiber braided body to a grounding terminal or the like. Alternatively, the above-described earth can have a configuration where between the above-described core of the twisted insulated core wires and the above-described conductive fiber braided body, a drain wire electrically coupled to this conductive fiber braided body is disposed.

As described above, when stripping the sheath, the braided body adhered to the sheath is simultaneously stripped; thus, the braided body at a terminal portion corresponding to this stripped sheath may all be removed. In such case, it becomes difficult to be grounded (earthed) by this braided body at the terminal portion.

However, separately, if a drain wire is disposed between the core of the twisted insulated core wires and the braided body, and if this drain wire is not cut in the above-described stripping work of the sheath (if the following nick t is not made on a drain wire 4), the drain wire may exist (remain) at the terminal after stripping the sheath and the braided body. That is, in this configuration, stripping the sheath may also remove all this braided body. Therefore, the drain wire is separately disposed. Usually, at the shield wire having the conductive fiber braided body, earth is performed by the braided body. Therefore, the drain wire is not disposed.

As means that interpose the above-described adhesive layer between the conductive fiber braided body and the sheath, various means are considered. For example, the following mean can be employed; in a manufacturing process of this shield wire, during the running of the core that forms the conductive fiber braided body, forming the adhesive layer on a whole surface of an outer periphery of this conductive fiber braided body by extrusion molding of the thermoplastic adhesive resin.

If the adhesive layer is formed in this way, because of the extrusion molding, the adhesive layer can be smoothly formed on the whole surface of the outer periphery of the braided body. In view of this, the braided body can be surely stripped with the stripping of the sheath. Furthermore, this facilitates the above-described improvement of the bending resistance and prevention of the deterioration of the shield property.

When the above-described conductive fiber braided body is made of a resin-coated fiber, tension resistance of this fiber may improve. Therefore, this reduces possibility where the fiber is cut in a braiding process and makes it difficult that fiber cut occurs when repeatedly receiving bending action on the shield wire using the braided body made of this fiber. Therefore, the bending resistance improves. A thickness of the resin coated on the fiber may be appropriately adjusted so as not to significantly influence the electromagnetic shield property whether in the case when coupling the conductive fiber braided body to the grounding terminal to ground or when contacting the conductive fiber braided body with the drain wire.

When employing the thermoplastic adhesive resin as the coating resin, in the process of extrusion molding of the sheath, the adhesive resin melts with heat of the sheath formed by extrusion molding on a surface of the braided body, and with the melted resin, the sheath may adhere to the braided body to ensure forming the above-described adhesive layer. Accordingly, the molding process of the adhesive layer by the above-described extrusion molding of the adhesive resin may be omitted. However, if more strong connection of the sheath and the braided body is desirable, the molding process of the adhesive layer may not be omitted. At this time, the heat in the extrusion molding of the sheath material is less likely to transmit to the coating resin at the side of the insulated core wires of the braided body. Therefore, degree that the braided body adheres to the insulated core wires is significantly low. As a result, the braided body does not become an obstacle of the above-described stripping work of the braided body.

Furthermore, when the above-described core has the insulated core wires twisted with an inclusion, or when the core has a cross-sectional circular shape by winding itself with a tape instead of using the inclusion, force (force against extrusion pressure) that presses from a side of the core to over a whole circumference of the braided body acts in the process of extrusion molding of the adhesive resin and the sheath. Therefore, over the whole circumference of an outer surface of the braided body, a circular shape adhesive layer without any irregularity is formed. As a result, the braided body and the sheath are certainly adhered via this adhesive layer. In view of this, when stripping the sheath, the braided body can be certainly stripped.

Incidentally, in a case where the cross-sectional surface of the core of the twisted insulated core wires has recessed space portions, like shield wire in PATENT LITERATURE 3 (see FIGS. 1 and 2 in PATENT LITERATURE 3), and when the shield layer is formed of the braided body, the braided body is rich in flexibility to get into the above-described recessed portions. Therefore, the outer periphery of this braided body is less likely to form a cross-sectional circular shape. In view of this, in the process of extrusion molding of the adhesive resin or the sheath, the adhesive layer formed on the whole surface of the outer periphery of the braided body also does not become the cross-sectional circular shape and thus unevenness is generated. Therefore, an adhesive strength of the braided body and the sheath via the adhesive layer is inferior to that of the present invention where the adhesive layer is formed into the above-described circular shape without any irregularity over the whole circumference of the outer surface of the braided body.

As conductors of the above-described insulated core wires, and the drain wire, well-known annealed copper twisted wires, annealed copper single wires, or the like can be employed. For example, twisted wires or a single wire of copper alloy with the following configuration excellent in the bending resistance can maintain an effective electromagnetic shield property over a long period of time even when repeatedly receiving the bending action.

The Component of Copper Alloy is as follows:
"Zr: 0.01 to 0.05 weight %, Cr: 0.01 to 0.05 weight %, or 0.002 to 0.3 weight % in a total amount of one or more of In, Sn, Ag, Al, Bi, Ca, Fe, Ge, Hf, Mg, Mn, Ni, Pb, Sb, Si, Ti, Zn, B, Y, and O may be added to them, and the rest part of the whole is substantially formed of Cu (see claim 2 in PATENT LITERATURE 4)".

Effects of the Invention

The present invention has the above-mentioned configuration to ensure providing the shield wire that is excellent in the bending resistance and the electromagnetic shield property and can facilitate the terminal processing.

DESCRIPTION OF THE EMBODIMENTS

Figure 1:
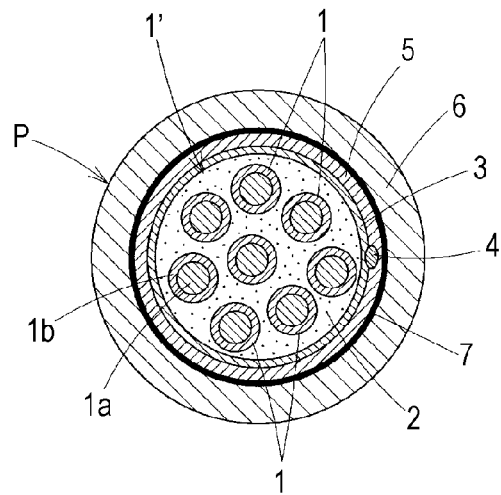
FIG. 1 is a cross-sectional view of one embodiment of a shield wire according to the present invention.
Figure 2:
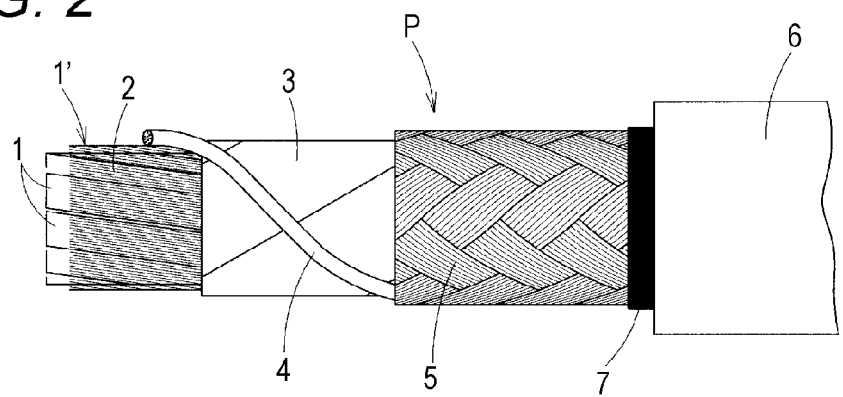
FIG. 2 is a front view of a main part partially cut of the embodiment.

FIG. 1 and FIG. 2 illustrate one embodiment of a shield wire P according to the present invention. This shield wire P is for a robot cable. The shield wire P is formed of eight twisted insulated core wires 1, an inclusion 2 between these respective insulated core wires 1, a tape 3 laterally wound around an outer periphery of a core 1' formed of these insulated core wires 1 and inclusion 2, a drain wire 4, which is over a whole wire length, disposed on an outer surface of the tape 3, a conductive fiber braided body 5 formed on an outer peripheral surface of the press tape 3 so as to interpose the drain wire 4, a sheath (a protecting layer) 6 that forms an outer peripheral surface of the braided body 5, and an adhesive layer 7 between the braided body 5 and sheath 6.

The insulated core wire 1 has an insulating coating 1b, which is polyvinyl chloride or the like, disposed on a copper alloy twisted wire 1a whose cross-sectional area is 0.2 mm$^2$. The number, an outside diameter, and the like of this insulated core wire 1 can be appropriately set corresponding to a usage aspect. According to this embodiment, the insulating coating 1b is made of polyvinyl chloride. The insulating coatings 1b of the respective insulated core wires 1 may have appropriately different colors such as red, green, black, or white to ensure identification.

The inclusion 2 is made of cotton yarn. The inclusion 2 is used for roundly finishing the core 1' when twisting the respective insulated core wires 1. Well-known material such as PPC yarn other than the cotton yarn can appropriately employed. The insulated core wires 1 are twisted via this inclusion 2. Therefore, this core 1' has a cross-sectional circular shape, as illustrated in FIG. 1.

The tape 3 is formed of a paper tape or a plastic tape. The tape 3 is vertically attached or laterally wound in order to maintain a cross-sectional circular shape of the core 1' formed of the insulated core wires 1 and the inclusion 2. In this embodiment, the tape 3 is laterally wound (wound around).

The drain wire 4 is formed of a copper alloy twisted wires whose cross-sectional area is 0.2 mm$^2$. The drain wire 4 is vertically attached or laterally wound. In this embodiment, one drain wire is laterally wound. The number of the drain wire 4 can be arbitrarily set.

The conductive fiber braided body 5 is made of carbon fiber, or copper-plating polyester fiber or the like. In this embodiment, both carbon fiber and copper-plating polyester fiber are separately used (different shield wires are made). Using the respective fibers, braid is performed with 100% of braid density.

The sheath 6 is made of well-known resin such as polyvinyl chloride, polyethylene, polyurethane, or polyester. In this embodiment, polyvinyl chloride is employed.

As the adhesive layer 7, resin having high adhesive property with respect to the braided body 5 and the sheath 6 can be appropriately employed. In this embodiment, polyester-based thermoplastic adhesive resin is used. The adhesive layer 7 may be formed of thermoplastic adhesive resin of polystyrene-based, vinyl acetate-based, polyethylene-based, polypropylene-based, polyamide-based, rubber-based, acrylic-based, or the like. Add-in material such as metal powders, carbon black, filler, or stiffener may be added to the adhesive layer 7. However, if these add-in materials are added more than a specific amount, the add-in materials may easily expose from a surface of the adhesive layer so that the satisfactory adhesive property to the sheath 6 may not be guaranteed. Therefore, when adding these add-in materials, amounts of these add-in materials are appropriately chosen considering the adhesive property.

The shield wire P in this embodiment has the above-mentioned configuration. For fabrication of the shield wire P, first, the insulated core wires 1 and the inclusion 2 are sent into a twisting machine to be twisted. The tape 3 is laterally wound around this twisted core 1'. Therewith, the drain wire 4 is laterally wound over the whole length of the wire. Furthermore, on this, the conductive fiber braided body 5 is formed using a braiding machine.

Next, the adhesive resin is extruded to form the adhesive layer 7 on a whole surface of the outer periphery of the core 1' on which this conductive fiber braided body 5 is formed, by an extruder. Furthermore, on this, the sheath 6 is disposed by the extrusion molding of the resin using the extruder. In this manner, the shield wire P according to the present invention is fabricated.

Such fabricated shield wire P can be used as robot cable for communication, for electric power, or the like. When receiving the bending action in accordance with the movement of a robot, the shield wire P has a configuration that is less likely to break at the braided body 5 and is excellent in the bending resistance because the braided body 5 adheres to the sheath 6 so as to be integrated, compared with the above-described conventional shield wire using a braided body.

Figure 3:
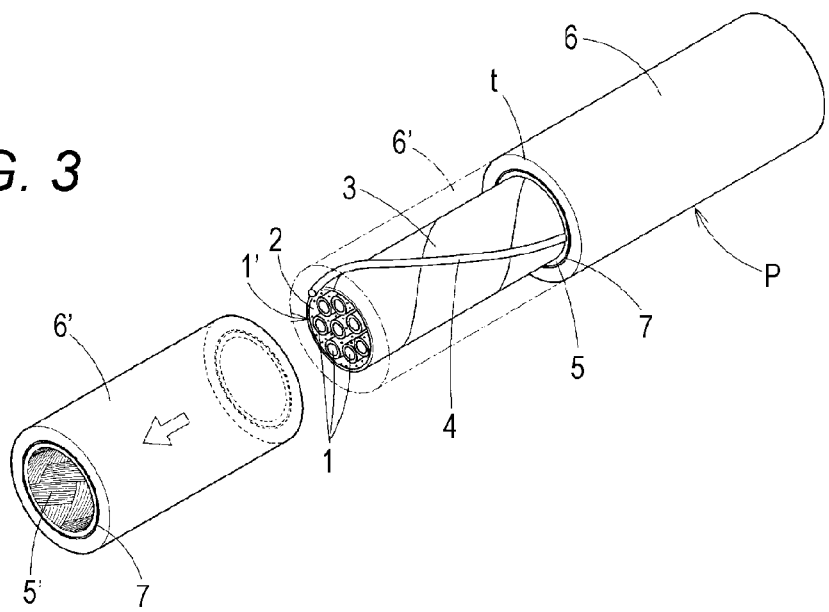
FIG. 3 is a perspective view for describing terminal processing of the embodiment.

In terminal processing of this shield wire P, first, as illustrated in FIG. 3, a nick t is made over a whole circumference of the sheath 6 at a necessary length part of the terminal by scissors or a stripper. This nick t is also made at the braided body 5 to the extent that the drain wire 4 is not cut (the nick t is not made at the drain wire 4). In this case, the core 1' is formed so as to have the cross-sectional circular shape, and furthermore, the extrusion molding of the adhesive resin forms the adhesive layer 7 on the whole surface of the outer periphery of the core 1'. Therefore, a braided body 5' of this terminal is certainly adhered (integrated) to a whole surface of an inner periphery of a sheath 6' by the adhesive layer 7. Therefore, the nick t can be easily made at the braided body 5', as well as the sheath 6'.

Next, under the state where the nick t is made, using the stripper or the like, the sheath 6' of the terminal is moved as the arrow in the Figure. Then, the braided body 5', as well as the sheath 6', is certainly stripped via the nick t. Then, the core 1' of the insulated core wires 1 around which the tape 3 is wound and the drain wire 4 is laterally wound is exposed (from a chain-line state to a solid-line state in FIG. 3).

Afterward, like the conventional one, the press tape 3 and the drain wire 4 are removed from the core 1' of the insulated core wires 1. Then, after finishing stripping the insulating coatings 1b of the insulated core wires 1, and the like, the insulated core wires 1 and the drain wire 4 are coupled to end terminals of various connectors and electrical devices.

At the shield wire P in the above-described embodiment, the above-described conductive fiber braided body 5 may be formed of resin-coated fiber.

Insofar as the coating resin is the thermoplastic adhesive resin, in the extrusion molding of the sheath 6, heat of the sheath 6 by extrusion molding melts the adhesive resin to adhere the sheath 6 to the braided body 5 and ensure forming the above-described adhesive layer 7. Accordingly, a formation process of the adhesive layer 7 by the above-described extrusion molding of the adhesive resin can be omitted. As the coating resin, resin having the high adhesive property with respect to the sheath 6 can be appropriately employed. For example, similar to the above-described one, the polyester system thermoplastic adhesive resin or the like can be employed.

For the conductor 1a of the above-described insulated core wire 1 and the drain wire 4, twisted wires or single wires of the above-described copper alloy wires can be employed.

On the other hand, the drain wire 4 can be omitted. In this aspect, the conductive fiber braided body 5 is used in order to be earthed. Specifically, when stripping the above-described braided body 5, one part of this braided body 5 is not stripped to be left. Then, for example, means that using the left braided body 5 to couple to a grounding terminal of the electrical device or the like can be employed. Describing the procedure in more detail, when the nick t is made at outer peripheries of the sheath 6 and the braided body 5 by the scissors or the like, the nick t is made over the whole outer periphery for the sheath 6. For the braided body 5, the nick t is made so as to leave a portion at which the nick t is not made at a part of the outer periphery. In this state, the necessary length of sheath 6' is stripped from the terminal. In this stripping, the sheath 6' is slowly stripped so as not to simultaneously strip the braided body 5 at the portion at which the nick t is not made. In this way, the part of the braided body 5 does not follow the sheath 6' and is left at a side of a product (a wire main body). Therefore, this left braided body 5 is coupled to the grounding terminal or the like of the electrical device or the like.

The tape 3 also can be omitted as long as it may not influence the twisting of the insulated core wires 1. At this time, the respective insulated core wires 1 are twisted with the inclusion 2. Then, the twisted core 1' is formed so as to have the cross-sectional circular shape roundly finished.

Furthermore, it is obvious that the shield wire P according to the present invention can be used for not only the robot cable, but also various cables or the like that request the bending resistance.

This application claims priority from Japanese Patent Application No. 2014-164408 filed with the Japanese Patent Office on Aug. 12, 2014, the entire contents of which are hereby incorporated by reference.

The above-disclosed embodiment is all considered as illustrative and not restrictive. The scope of the invention is indicated by the appended claims. All variations and equivalents which fall within the range of the appended claims are intended to be embraced therein.

LIST OF REFERENCE NUMERALS

P: Shield wire
t: Nicks of sheath and braided body
1: Insulated core wire
1a: Conductor of insulated core wire
1b: Insulating coating of insulated core wire
1': Core of twisted insulated core wires
2: Inclusion
3: Tape
4: Drain wire
5: Conductive fiber braided body
5': Stripped terminal braided body
6: Sheath (Protecting layer)
6': Stripped terminal sheath
7: Adhesive layer

The invention claimed is:

1. A shield wire comprising: a plurality of insulated core wires twisted to form a core, a conductive fiber braided body formed on an outer periphery of the core, and a sheath disposed outside the conductive fiber braided body, wherein an adhesive layer is interposed between the conductive fiber braided body and the sheath, the adhesive layer adheres the conductive fiber braided body to the sheath, the adhesive layer is disposed on a whole surface of an outer periphery of the conductive fiber braided body by extrusion molding of a thermoplastic adhesive resin, and the conductive fiber braided body is made of a resin-coated conductive fiber.

2. The shield wire according to claim 1, wherein between the core of the twisted insulated core wires and the conductive fiber braided body, a drain wire is disposed to be electrically coupled to the conductive fiber braided body.

3. The shield wire according to claim 1, wherein the coating resin is a thermoplastic adhesive resin.

4. The shield wire according to claim 1, wherein a cross-sectional surface of the core is formed into a circular shape by twisting the insulated core wires with an inclusion.

5. The shield wire according to claim 2, wherein the cross-sectional surface of the core is formed into a circular shape by twisting the insulated core wires with an inclusion.

6. The shield wire according to claim 3, wherein a cross-sectional surface of the core is formed into a circular shape by twisting the insulated core wires with an inclusion.

* * * * *